(12) United States Patent
Zhang (10) Patent No.: US 11,880,597 B2
(45) Date of Patent: Jan. 23, 2024

(54) READ OPERATION CIRCUIT, SEMICONDUCTOR MEMORY, AND READ OPERATION METHOD

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 358 days.

(21) Appl. No.: 17/242,215

(22) Filed: Apr. 27, 2021

(65) Prior Publication Data
US 2021/0247938 A1    Aug. 12, 2021

Related U.S. Application Data

(63) Continuation of application No. PCT/CN2020/097410, filed on Jun. 22, 2020.

(30) Foreign Application Priority Data

Oct. 25, 2019    (CN) .......................... 201911021588.8

(51) Int. Cl.
 *G06F 3/06*    (2006.01)
(52) U.S. Cl.
 CPC .......... *G06F 3/0659* (2013.01); *G06F 3/0604* (2013.01); *G06F 3/0673* (2013.01)
(58) Field of Classification Search
 CPC .............................. G06F 3/0659; G06F 3/0604
 See application file for complete search history.

(56) References Cited

U.S. PATENT DOCUMENTS

| 2010/0057971 A1 | 3/2010 | Kao | |
| 2011/0205824 A1* | 8/2011 | Kajigaya | G11C 7/1006 |
| | | | 365/219 |

(Continued)

FOREIGN PATENT DOCUMENTS

| CN | 101771497 A | 7/2010 |
| CN | 102611951 A | 7/2012 |
| CN | 210667806 U | 6/2020 |

OTHER PUBLICATIONS

Anonymous: "XOR gate—Wikipedia", Apr. 25, 2019 (Apr. 25, 2019), pp. 1-5, XP055917192, Retrieved from the Internet: URL:https://en.wikipedia.org/w/index.php?title=XOR_gate&oldid=894014248.

*Primary Examiner* — Edward J Dudek, Jr.
(74) *Attorney, Agent, or Firm* — Kilpatrick Townsend & Stockton LLP (57) ABSTRACT

Embodiments provide a read operation circuit, a semiconductor memory, and a read operation method. The read operation circuit includes: a data determination module configured to read read data from the memory bank, and determine, according to the number of bits of a data change between previous read data and current read data, whether to invert the current read data to output global bus data for transmission through a global bus and inversion flag data for transmission through an inversion flag signal line; a data receiving module configured to determine whether to invert the global bus data according to the inversion flag data to output cache data; a parallel-to-serial conversion circuit configured to perform parallel-to-serial conversion on the cache data to generate output data of a DQ port; and a data buffer module configured to determine an initial state of the global bus according to enable signal and current read data.

12 Claims, 5 Drawing Sheets

(56) References Cited

U.S. PATENT DOCUMENTS

| | | | |
|---|---|---|---|
| 2013/0111102 A1* | 5/2013 | Kim | G11C 7/1006 |
| | | | 711/E12.001 |
| 2013/0159584 A1* | 6/2013 | Nygren | G06F 13/4273 |
| | | | 710/305 |
| 2014/0016404 A1 | 1/2014 | Kim et al. | |
| 2015/0067437 A1* | 3/2015 | Bains | G06F 11/1048 |
| | | | 714/758 |
| 2018/0047432 A1* | 2/2018 | Kondo | G11C 5/025 |
| 2018/0285304 A1* | 10/2018 | Kozhikkottu | G06F 13/36 |
| 2018/0357188 A1* | 12/2018 | Brief | G06F 13/1668 |
| 2019/0172512 A1* | 6/2019 | Oh | G11C 29/1201 |

* cited by examiner

READ OPERATION CIRCUIT, SEMICONDUCTOR MEMORY, AND READ OPERATION METHOD

CROSS REFERENCE

This application is a continuation of PCT/CN2020/097410, filed on Jun. 22, 2020, which claims priority to Chinese Patent Application No. 201911021588.8, titled "READ OPERATION CIRCUIT, SEMICONDUCTOR MEMORY, AND READ OPERATION METHOD" and filed to the State Intellectual Property Office on Oct. 25, 2019, the entire contents of which are incorporated herein by reference.

TECHNICAL FIELD

The present disclosure relates to the field of semiconductor memory technologies, and more particularly, to a read operation circuit, a semiconductor memory, and a read operation method.

BACKGROUND

A semiconductor memory includes a static random-access memory (SRAM), a dynamic random access memory (DRAM), a synchronous dynamic random access memory (SDRAM), a read-only memory (ROM), and a flash memory, etc.

In a DRAM protocol of the Joint Electron Device Engineering Council (JEDEC), there are requirements for speed and power saving of the DRAM. How to ensure the DRAM to be more power-saving while ensuring the integrity of a signal and the reliability of data transmission and storage is a problem to be solved urgently in the industry.

SUMMARY

Embodiments of the present disclosure provide a read operation circuit, a semiconductor memory, and a read operation method to solve or alleviate one or more technical problems in the existing technologies.

In a first aspect, the embodiments of the present disclosure provide a read operation circuit used in a semiconductor memory, wherein the semiconductor memory includes a Data Queue (DQ) port and a memory bank. The read operation circuit comprising:

a data determination module connected to the memory bank, wherein the data determination module is configured to read read data from the memory bank, and determine, according to the number of bits of a data change between previous read data and current read data, whether to invert the current read data to output global bus data for transmission through a global bus and inversion flag data for transmission through an inversion flag signal line;

a data receiving module connected to the global bus and the inversion flag signal line and configured to determine whether to invert the global bus data according to the inversion flag data to output cache data;

a parallel-to-serial conversion circuit connected between the data receiving module and the DQ port and configured to perform parallel-to-serial conversion on the cache data to generate output data of the DQ port; and a data buffer module connected to the memory bank through the global bus, wherein the data buffer module is configured to receive an enable signal to determine an initial state of the global bus according to the enable signal and the current read data.

In one embodiment, the data determination module is configured to determine change flag data according to the change between the current read data and the previous read data, output inverted data of the current read data as the global bus data and set the inversion flag data to High if the number of bits of high data in the change flag data is greater than a preset value, and output original current read data as the global bus data and set the inversion flag data to Low if the number of bits of the high data in the change flag data is less than or equal to the preset value.

In one embodiment, the data determination module comprises:

a data comparison unit, an input terminal of the data comparison unit being connected to the memory bank, wherein the data comparison unit is configured to set the change flag data to Low if there is no change between the current read data and the previous read data, and set the change flag data to High if there is the change between the current read data and the previous read data;

a data determination unit, an input terminal of the data determination unit being connected to an output terminal of the data comparison unit to receive the change flag data, an output terminal of the data determination unit being connected to the inversion flag signal line, wherein the data determination unit is configured to set the inversion flag data to High if the number of bits of the high data in the change flag data is greater than the preset value, and set the inversion flag data to Low if the number of bits of the high data in the change flag data is less than or equal to the preset value; and a data selector, an input terminal of the data selector being configured to receive the inversion flag data through the inversion flag signal line, an output terminal of the data selector being connected to the global bus, wherein the data selector is configured to output inverted data of the current read data as the global bus data if the inversion flag data is High, and output the original current read data as the global bus data if the inversion flag data is Low.

In one embodiment, the data comparison unit comprises:

a latch connected to the memory bank and configured to latch a state of the previous read data and a previous clock signal corresponding to the previous read data; and a state comparator connected to the memory bank and the latch, wherein the state comparator is configured to set the change flag data to Low if there is no change between a state of the current read data and the state of the previous read data, and set the change flag data to High if there is a change between the state of the current read data and the state of the previous read data.

In one embodiment, the change flag data and the global bus data are both divided into M groups, the inversion flag data has M bits, the M-bit inversion flag data is corresponding to the M groups of change flag data one to one, and the M-bit inversion flag data is corresponding to the M groups of global bus data one to one, wherein the M is an integer greater than 1.

In one embodiment, each group of change flag data has N bits, wherein the N is an integer greater than 1. The data determination module is configured to output inverted data of a group of change flag data inputted as a corresponding group of global bus data and set 1-bit inversion flag data corresponding to the group of change flag data inputted to High if the number of bits of high data in the group of change flag data inputted is greater than N/2, and output a group of change flag data inputted as a corresponding group of global bus data and set 1-bit inversion flag data corresponding to the group of change flag data inputted to Low if the number of bits of the high data in the group of change flag data inputted is less than or equal to N/2.

In one embodiment, the data selector includes M data selection units, and each of the M data selection units comprising:
- a first inverter, wherein an input terminal of the first inverter being configured to receive the inversion flag data through the inversion flag signal line;
- a second inverter, wherein an input terminal of the second inverter being configured to receive the current read data;
- a first transmission gate, an input terminal of the first transmission gate being connected to an output terminal of the second inverter, an output terminal of the first transmission gate being connected to the global bus to output the global bus data, a negative control terminal of the first transmission gate being connected to an output terminal of the first inverter, and a positive control terminal of the first transmission gate is configured to receive the inversion flag data through the inversion flag signal line; and
- a second transmission gate, an input terminal of the second transmission gate being configured to receive the current read data, an output terminal of the second transmission gate being connected to the global bus to output the global bus data, a negative control terminal of the second transmission gate being configured to receive the inversion flag data through the inversion flag signal line, and a positive control terminal of the second transmission gate being connected to the output terminal of the first inverter.

In one embodiment, the data receiving module is configured to output inverted data of the global bus data as the cache data if the inversion flag data is High, and output original global bus data as the cache data if the inversion flag data is Low.

In one embodiment, the data receiving module includes a plurality of data receiving units, and each of the plurality of data receiving units comprising:
- a third inverter, an input terminal of the third inverter being configured to receive the inversion flag data through the inversion flag signal line;
- a fourth inverter, an input terminal of the fourth inverter being configured to receive the global bus data through the global bus;
- a third transmission gate, an input terminal of the third transmission gate being connected to an output terminal of the fourth inverter, an output terminal of the third transmission gate being connected to the parallel-to-serial conversion circuit to output the cache data to the parallel-to-serial conversion circuit, a negative control terminal of the third transmission gate being connected to an output terminal of the third inverter, and a positive control terminal of the third transmission gate being configured to receive the inversion flag data through the inversion flag signal line; and
- a fourth transmission gate, an input terminal of the fourth transmission gate being configured to receive the global bus data through the global bus, an output terminal of the fourth transmission gate being connected to the parallel-to-serial conversion circuit to output the cache data to the parallel-to-serial conversion circuit, a negative control terminal of the fourth transmission gate being configured to receive the inversion flag data through the inversion flag signal line, and a positive control terminal of the fourth transmission gate being connected to the output terminal of the third inverter.

In one embodiment, the data buffer module comprises:
- a plurality of logic NAND gates, wherein two input terminals of each of the plurality of logic NAND gates being configured to receive the enable signal and the current read data respectively;
- a plurality of fifth inverters, an input terminal of each of the plurality of fifth inverters being configured to receive the enable signal;
- a plurality of logic NOR gates, two input terminals of each of the plurality of logic NOR gates being configured to receive the current read data and connected to each of the plurality of fifth inverters respectively;
- a plurality of PMOS transistors, a gate of each of the plurality of PMOS transistors being connected to an output terminal of each of the plurality of logic NAND gates, and a drain of each of the plurality of PMOS transistors being connected to the global bus; and
- a plurality of NMOS transistors, a gate of each of the plurality of NMOS transistors being connected to an output terminal of each of the plurality of logic NOR gates, and a drain of each of the plurality of NMOS transistors being connected to the global bus and the drain of each of the plurality of NMOS transistors.

In a second aspect, the embodiments of the present disclosure provide a semiconductor memory, comprising a DQ port, a memory bank, and the read operation circuit according to any one of the above embodiments.

In a third aspect, the embodiments of the present disclosure provide a read operation method used in a semiconductor memory. The read operation method comprises:
- determining an initial state of a global bus according to an enable signal and current read data;
- determining, according to the number of bits of a data change between previous read data and the current read data, whether to invert the current read data to output global bus data for transmission through a global bus and inversion flag data for transmission through an inversion flag signal line;
- determining whether to invert the global bus data according to the inversion flag data to output cache data; and
- performing parallel-to-serial conversion on the cache data to generate output data of the DQ port.

In one embodiment, the determining, according to the number of bits of a data change between previous read data and the current read data, whether to invert the current read data to output global bus data for transmission through a global bus and inversion flag data for transmission through an inversion flag signal line comprises:
- determining change flag data according to the change between the current read data and the previous read data; and
- outputting inverted data of the current read data as the global bus data and setting the inversion flag data to High if the number of bits of high data in the change flag data is greater than a preset value, and outputting original current read data as the global bus data and setting the inversion flag data to Low if the number of bits of the high data in the change flag data is less than or equal to the preset value.

In one embodiment, the outputting inverted data of the current read data as the global bus data and setting the inversion flag data to High if the number of bits of high data in the change flag data is greater than a preset value, and outputting original current read data as the global bus data and setting the inversion flag data to Low if the number of bits of the high data in the change flag data is less than or equal to the preset value comprises:

dividing the change flag data into M groups, wherein each group of change flag data has N bits, both the M and the N being integers greater than 1;

outputting inverted data of a group of change flag data inputted as a corresponding group of global bus data and setting 1-bit inversion flag data corresponding to the group of change flag data inputted to High if the number of bits of high data in the group of change flag data inputted is greater than N/2; and outputting a group of change flag data inputted as a corresponding group of global bus data and setting 1-bit inversion flag data corresponding to the group of change flag data inputted to Low if the number of bits of the high data in the group of change flag data inputted is less than or equal to N/2.

According to the technical solutions of the embodiments of the present disclosure, the number of inversions of an internal global bus can be reduced in a tristate architecture, such that electric current is reduced significantly, and power consumption is decreased.

The above summary is for the purpose of illustration only and is not intended to be limiting in any way. In addition to the illustrative aspects, embodiments, and features described above, further aspects, embodiments, and features of the present disclosure will be readily apparent by reference to the drawings and the following detailed description.

BRIEF DESCRIPTION OF THE DRAWINGS

In the drawings, the same reference numerals denote the same or similar parts or elements throughout the several drawings unless otherwise specified. These drawings are not necessarily drawn to scale. It should be understood that these drawings depict only some embodiments disclosed according to the present disclosure and should not be deemed as limitations on the scope of the present disclosure.

REFERENCE NUMBERS IN THE ACCOMPANYING DRAWINGS

20: semiconductor memory;
21: parallel-to-serial conversion circuit;
22: data buffer module;
23: data determination module;
24: DQ port;
25: data receiving module;
26: memory bank;
221: PMOS transistor;
222: NMOS transistor;
223: logic NAND gate;
224: logic NOR gate;
225: fifth inverter;
231: data determination unit;
232: data selector;
233: data comparison unit;
233A: latch;
233B: state comparator;
232': data selection unit;
232A: first inverter;
232B: second inverter;
232C: first transmission gate;
232D: second transmission gate;
233A: latch;
233B: state comparator;
250: data receiving unit;
251: third inverter;
252: fourth inverter;
253: third transmission gate; and
254: fourth transmission gate.

DETAILED DESCRIPTION

The exemplary embodiment will now be described more fully with reference to the accompanying drawings. However, the exemplary embodiments can be implemented in a variety of forms and should not be construed as being limited to the embodiments set forth herein. Rather, these embodiments are provided such that the present disclosure will be thorough and complete and will fully convey the concepts of the exemplary embodiments to those skilled in the art. The same reference numerals in the drawings denote the same or similar parts, and thus repeated description thereof will be omitted.

Figure 1:
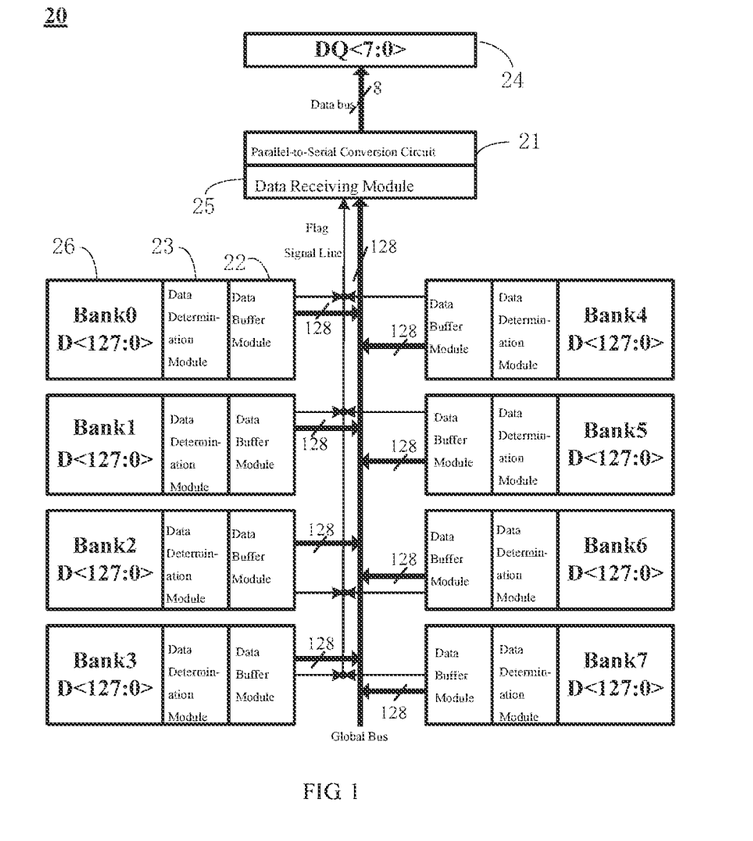
FIG. 1 schematically illustrates a block diagram of a partial structure of a semiconductor memory according to an implementation manner of this embodiment.

FIG. 1 schematically illustrates a block diagram of a partial structure of a semiconductor memory according to an implementation manner of this embodiment. As shown in FIG. 1, the semiconductor memory 20 includes a DQ port 24, a memory bank 26, and a read operation circuit. The read operation circuit includes a global bus, an inversion flag signal line, a data determination module 23, a data buffer module 22, a data receiving module 25, and a parallel-to-serial conversion circuit 21. In one embodiment, the semiconductor memory 20 is a dynamic random access memory (DRAM), such as a double data rate SDRAM 4 (abbreviated as DDR4).

In one example, as shown in FIG. 1, an active command can enable the only designated memory bank 26, and the read operation can only be performed on one memory bank 26. That is, when one memory bank among eight memory banks 26 (i.e. Bank<7:0>) is operating, the other memory banks are not operating. By means of the read operation circuit, the read data D<127:0> in the memory bank 26 outputs 8-bit output data DQ<7:0> through the DQ port 24. It is to be noted that the number of memory banks 26, the number of data bits of each memory bank 26, and the number of data bits of the DQ port 24 and the number of DQ ports 24 are not limited in this embodiment. For example, there may be one DQ port 24 configured to output 16-bit output data. There may also be two DQ ports 24, and each of the two DQ ports 24 is configured to output 8-bit output data.

Figure 2:
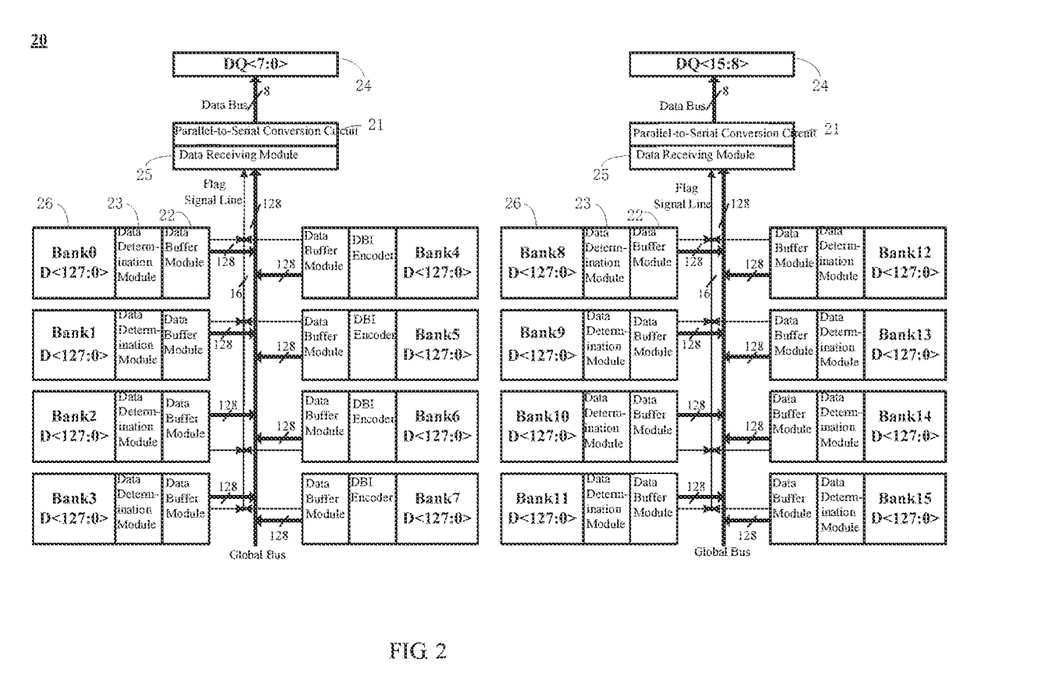
FIG. 2 schematically illustrates a block diagram of a partial structure of the semiconductor memory according to another implementation manner of this embodiment.

For example, as shown in FIG. 2, the output data DQ<7:0> is obtained by performing a read operation on a group of memory banks Bank<7:0> by one read operation circuit mentioned above, and the output data DQ<15:8> is obtained by performing a read operation on another group of memory banks Bank<15:8> by another read operation circuit mentioned above. Correspondingly, among eight memory banks 26 (i.e., Bank<15:8>) corresponding to the output data DQ<15:8>, when one memory bank is operating, the other memory banks are not operating.

The semiconductor memory 20 has an array structure, and each unit may have the same structure. However, because inputted data are different, data outputted by each unit may be different. The read operation circuit of this embodiment is introduced below by taking one of the memory banks as an example.

The data determination module 23 is connected to the memory bank 26 and is configured to read read data such as D<127:0> from the memory bank 26. A read operation is performed with a clock signal. A previous read operation is corresponding to a previous clock signal, and the previous read data is read. A current read operation is corresponding to a current clock signal, and the current read data is read. Thus, the data determination module 23 is also configured to determine, according to the number of bits of a data change between the previous read data and the current read data, whether to invert the current read data to output global bus data for transmission through a global bus and inversion flag data for transmission through an inversion flag signal line.

In one embodiment, the data determination module 23 is configured to determine change flag data according to the change between the current read data and the previous read data, output inverted data of the current read data as the global bus data and set the inversion flag data to High if the number of bits of high data in the change flag data is greater than a preset value, and output original current read data as the global bus data and set the inversion flag data to Low if the number of bits of the high data in the change flag data is less than or equal to the preset value.

High data may be data equal to "1", and low data may be data equal to "0". Inversion of data may be understood as inversion from "0" to "1", or inversion from "1" to "0". The inversion of a data line or a signal line may be understood as inversion from a high level to a low level, or inversion from a low level to a high level.

Figure 3:
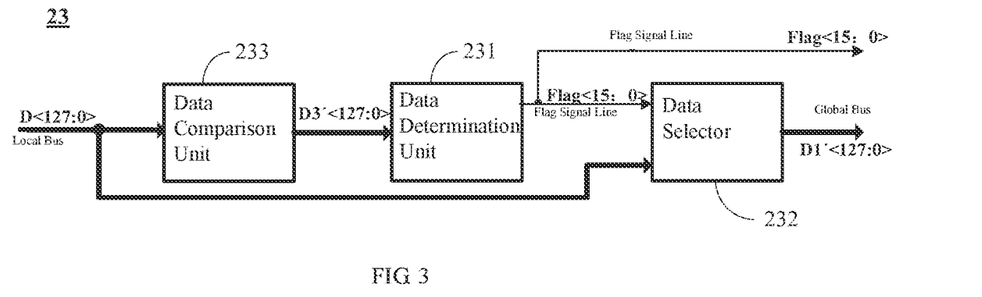
FIG. 3 schematically illustrates a block diagram of a data determination module according to an implementation manner of this embodiment.

In one embodiment, as shown in FIG. 3, the data determination module 23 may include a data comparison unit 233, a data determination unit 231, and a data selector 232.

An input terminal of the data comparison unit 233 is connected to the memory bank 26 to receive the read data. For example, the input terminal of the data comparison unit 233 may receive the current read data through a local bus. The data comparison unit 233 is configured to set the change flag data (such as D3'<127:0>) to Low if there is no change between the current read data and the previous read data, and set the change flag data to High if there is the change between the current read data and the previous read data.

Figure 4:
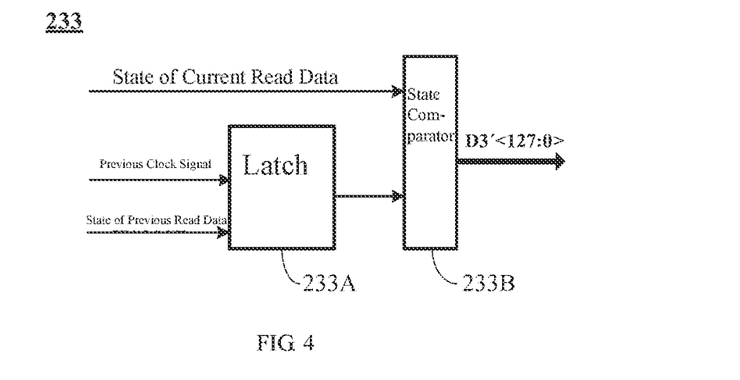
FIG. 4 schematically illustrates a block diagram of a data comparison unit according to an implementation manner of this embodiment.

In one embodiment, as shown in FIG. 4, the data comparison unit 233 includes a latch 233A and a state comparator 233B. The latch 233A is connected to the memory bank 26. For example, the latch 233A may be connected to the local bus to latch a state of the previous read data and a previous clock signal (Pre-Clock) corresponding to the previous read data. The state comparator 233B is connected to the memory bank 26. For example, the state comparator 233B may be connected to the local bus. The state comparator 233B is also connected to the latch 233A, and the state comparator 233B is configured to set the change flag data to Low if there is no change between a state of the current read data and the state of the previous read data, and set the change flag data to High if there is a change between the state of the current read data and the state of the previous read data.

An input terminal of the data determination unit 231 is connected to an output terminal of the data comparison unit 233 to receive the change flag data. An output terminal of the data determination unit 231 is connected to the inversion flag signal line. The data determination unit 231 is configured to set the inversion flag data to High if the number of bits of high data in the change flag data is greater than a preset value, and set the inversion flag data to Low if the number of bits of the high data in the change flag data is less than or equal to the preset value.

An input terminal of the data selector 232 is configured receive the inversion flag data through the inversion flag signal line, and may receive the current read data through the local bus. An output terminal of the data selector 232 is connected to the global bus. The data selector 232 is configured to output inverted data of the current read data as the global bus data if the inversion flag data is High, and output original current read data as the global bus data if the inversion flag data is High.

In one example, multi-bit change flag data is not grouped. That is, the inversion flag data may be 1-bit data. In one example, the multi-bit change flag data may be grouped. For example, in one embodiment, the change flag data and the global bus data are both divided into M groups, the inversion flag data has M bits, the M-bit inversion flag data is corresponding to the M groups of change flag data one to one, and the M-bit inversion flag data is corresponding to the M groups of global bus data one to one, wherein the M is an integer greater than 1.

Further, each group of change flag data may have N bits, wherein the N is an integer greater than 1. The data determination module 23 is configured to output inverted data of a group of change flag data inputted as a corresponding group of global bus data and set 1-bit inversion flag data corresponding to the group of change flag data inputted to High if the number of bits of high data in the group of change flag data inputted is greater than N/2, and output a group of change flag data inputted as a corresponding group of global bus data and set 1-bit inversion flag data corresponding to the group of change flag data inputted to Low if the number of bits of the high data in the group of change flag data inputted is less than or equal to N/2.

For example, the change flag data D3'<127:0> is divided into 16 groups, each group of change flag data has 8 bits, and each group of change flag data is corresponding to 1-bit inversion flag data. Correspondingly, the inversion flag data has 16 bits, such as Flag<15:0>. The global bus data D1'<127:0> will also be divided into 16 groups accordingly. Each 1-bit inversion flag data is corresponding to a group of global bus data. For a group of change flag data D3'<127:120>, if the number of bits equal to "1" in D3'<127:120> is greater than 4 bits, the corresponding Flag<15>=1, and a group of global bus data D1'<120:127> outputted is equal to the inverted data of the current read data D<127:120>; and if the number of bits equal to "1" in D3'<127:120> is less than or equal to 4 bits, the corresponding Flag<15>=0, and a group of global bus data D1'<120:127> outputted is D<127:120>.

Hence, when Flag<15>=1, the global bus data D1'<127:120> outputted from the data determination module 23 is the inverted data of the current read data D<127:120> of the memory bank 26 (such as Bank0). When the Flag<15>=0, the global bus data D1'<127:120> outputted from the data determination module 23 is the current read data D<127:120> of the memory bank 26 (such as Bank0). That is, the global bus data D1'<127:120>=D<127:120>. Similarly, when Flag<1>=1, the global bus data D1'<15:8> outputted from the data determination module 23 is the inverted data of the current read data D<15:8> of the memory bank 26 (such as Bank0). When Flag<1>=0, the global bus data D1'<15:8> outputted from the data determination module 23 is the current read data D<15:8>. That is, the global bus data D1'<15:8>=D<15:8>. When Flag<0>=1, the global bus data D1'<7:0> outputted from the data determination module 23 is the inverted data of the current read data D<7:0> of the memory bank 26 (such as Bank0). When the Flag<0>=0, the global bus data D1'<7:0> outputted from the data determination module 23 is the current read data D<7:0> of the memory bank 26 (such as Bank0). That is, the global bus data D1'<7:0>=D<7:0>.

In one example, there are a plurality of global buses, which are divided into M (M is an integer greater than 1) groups, wherein each global bus transmits 1-bit global bus data. For example, there are 128 global buses, which are divided into 16 groups. The global bus <0> transmits global bus data D1'<0>; the global bus <1> transmits global bus data D1'<1>; . . . ; and the global bus <127> transmits global bus data D1'<127>.

In one example, there are 16 inversion flag signal lines, and each inversion flag signal line transmits 1-bit inversion flag data. For example, the inversion flag signal line <0> transmits inversion flag data Flag<0>, and is corresponding to the global bus data D1'<7:0> to manifest whether D1'<7:0> is the inverted data. The inversion flag signal line <1> transmits inversion flag data Flag<1>, and is corresponding to the global bus data D1'<15:8> to manifest whether D1'<15:8> is the inverted data; . . . ; and the inversion flag signal line <15> transmits inversion flag data Flag<15>, and is corresponding to the global bus data D1'<127:120> to manifest whether D1'<127:120> is the inverted data.

The data buffer module 22 is connected to the memory bank 26 through the global bus, and the data buffer module 22 is configured to receive an enable signal to determine an initial state of the global bus according to the enable signal and the current read data. That is, in this embodiment, the semiconductor memory 20 uses a tristate global bus transmission structure.

Figure 5:
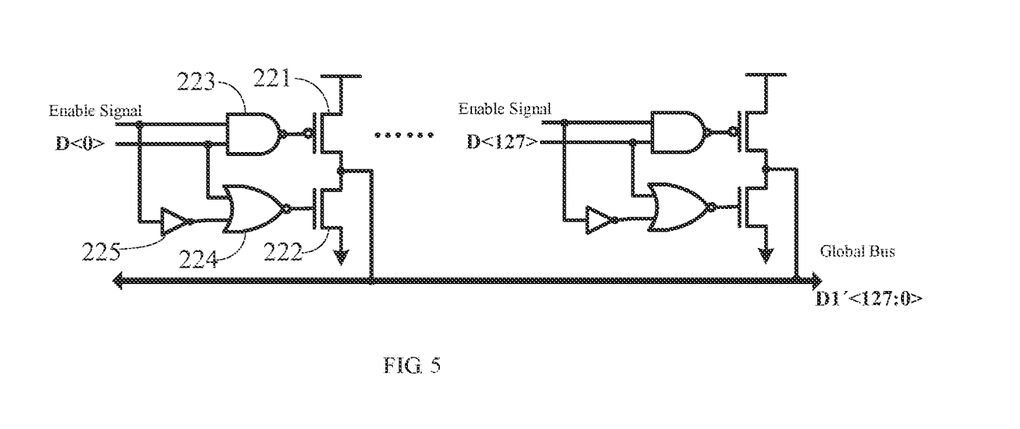
FIG. 5 schematically illustrates a circuit diagram of a data buffer module according to an implementation manner of this embodiment.

FIG. 5 schematically illustrates a circuit diagram (corresponding to one memory bank 26) of the data buffer module 22 according to an implementation manner of this embodiment. As shown in FIG. 5, the data buffer module 22 includes a plurality of positive channel metal oxide semiconductor (PMOS) transistors 221, a plurality of negative channel metal oxide semiconductor (NMOS) transistors 222, a plurality of logic NAND gates 223, a plurality of fifth inverters 225, and a plurality of logic NOR gates 224.

Two input terminals of each of the plurality of logic NAND gates 223 are configured to receive the enable signal and the current read data respectively. An input terminal of each of the plurality of fifth inverters 225 is configured to receive the enable signal. Two input terminals of each of the plurality of logic NOR gates 224 are configured to receive the current read data and connected to each of the plurality of fifth inverters 225 respectively. A gate of each of the plurality of PMOS transistors 221 is connected to an output terminal of each of the plurality of logic NAND gates 223, and a drain of each of the plurality of PMOS transistors 221 is connected to the global bus. A gate of each of the plurality of NMOS transistors 222 is connected to an output terminal of each of the plurality of logic NOR gates 224, and a drain of each of the plurality of NMOS transistors 222 is connected to the global bus. The drain of each of the plurality of PMOS transistors 221 is connected to the drain of each of the plurality of NMOS transistors 222.

It is to be noted that the plurality of PMOS transistors 221, the plurality of NMOS transistors 222, the plurality of logic NAND gates 223, the plurality of fifth inverters 225, and the plurality of logic NOR gates 224 are divided into a plurality of groups, and each of the plurality of groups is corresponding to 1-bit read data.

In the related technologies, under a tristate architecture, the global bus will be inverted along with flip-flop of the read data in the process of a read operation. If the read data is "1", information "1" is transmitted through an internal global bus. If the read data is "0", information "0" is transmitted through the internal global bus. In this way, if all the previous read data are "1" and all the current read data are "0", each of the plurality of global buses is inverted. In the semiconductor memory 20 as shown in FIG. 2, there is a 256-bit wide global bus, there is a 256-bit global bus inverted, and there is a large line transmission current. Therefore, in the related technologies, under the tristate architecture, when data are read, if there are too many changed data transmitted in the global bus, the number of global buses inverted is large, which may cause increase of the electric current.

However, in the embodiments of the present disclosure, through the data determination module 23, in the process of the read operation of the global bus, if the number of bits of the data change between the current read data and the previous read data is large, one inversion flag data may be generated to invert all the current read data, such that the number of inversions of the global bus will be greatly reduced, or even no global bus is inverted. Thus the electric current can be saved.

In one example, the data determination unit 231 may include a plurality of data determination subunits, and each of the plurality of data determination subunits is configured to process a group of change flag data, and then output 1-bit inversion flag data. For example, there may be 16 data selection unit subunits, which are respectively corresponding to 16 groups of change flag data, and then 16-bit inversion flag data is outputted, wherein each group of change flag data may have 8 bits.

In one embodiment, the data selector 232 includes M data selection units 232', and each of the M data selection units 232' is configured to process 1-bit inversion flag data and a group of current read data. For example, there may be 16 data selection units 232', which are respectively corresponding to 16 groups of current read data and 1-bit inversion flag data, wherein each group of current read data may have 8 bits.

Figure 6:
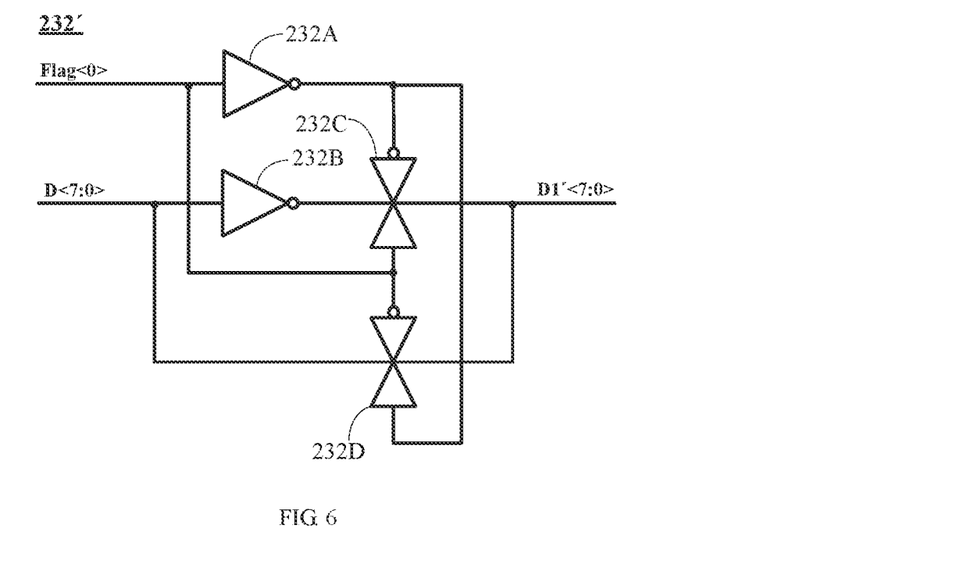
FIG. 6 schematically illustrates a block diagram of a data selection unit according to an implementation manner of this embodiment.

FIG. 6 illustrates an implementation manner of the data selection unit 232'. As shown in FIG. 6, the data selection unit 232' includes a first inverter 232A, a second inverter 232B, a first transmission gate 232C, and a second transmission gate 232D.

An input terminal of the first inverter 232A is configured to receive the inversion flag data through the inversion flag signal line. An input terminal of the second inverter 232B is configured to receive the current read data. An input terminal of the first transmission gate 232C is connected to an output terminal of the second inverter 232B, an output terminal of the first transmission gate 232C is connected to the global bus to output the global bus data, a negative control terminal (the upper control terminal in FIG. 6) of the first transmission gate 232C is connected to an output terminal of the first inverter 232A, and a positive control terminal (the lower control terminal in FIG. 6) of the first transmission gate 232C is configured to receive the inversion flag data through the inversion flag signal line. An input terminal of the second transmission gate 232D is configured to receive the current read data, an output terminal of the second transmission gate 232D is connected to the global bus to output the global bus data, a negative control terminal of the second transmission gate 232D is configured to receive the inversion flag data through the inversion flag signal line, and a positive control terminal of the second transmission gate 232D is connected to the output terminal of the first inverter 232A.

Taking Flag<0> and the current read data D<7:0> as an example, as shown in FIG. 6, when Flag=1, the global bus data D1'<7:0> is the inverted data of the current read data D<7:0>; and when Flag=0, the global bus data D1'<7:0> is the current read data D<7:0>.

It is to be noted that a group of second inverter 232B, first transmission gate 232C and second transmission gate 232D is configured to process 1-bit current read data and output 1-bit corresponding global bus data. That is, corresponding to 8-bit current read data D<7:0>, there should be eight groups of second inverters 232B, first transmission gates 232C and second transmission gates 232D, and then 8-bit global bus data D1'<7:0> is outputted.

Figure 7:
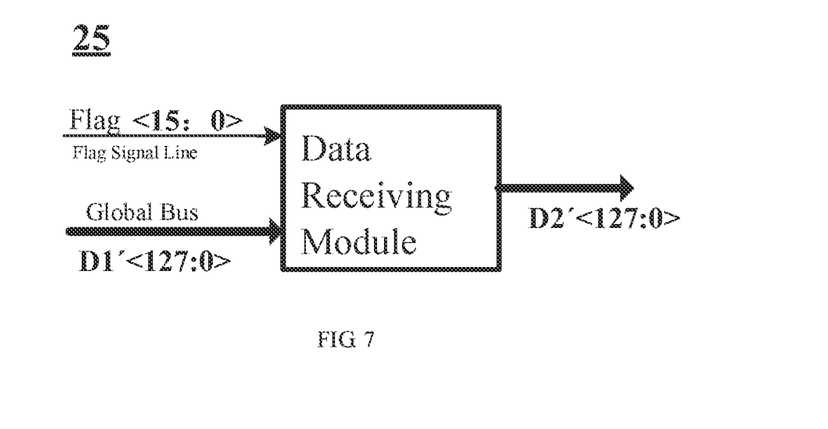
FIG. 7 schematically illustrates a block diagram of a data receiving module according to an implementation manner of this embodiment.

As shown in FIG. 1, FIG. 2 and FIG. 7, the read operation circuit in this embodiment further includes a data receiving module 25, which is connected to the global bus and the inversion flag signal line respectively and is configured to determine whether to invert the global bus data according to the inversion flag data to output cache data such as D2'<127:0>. For example, the data receiving module 25 is configured to output inverted data of the global bus data as the cache data if the inversion flag data is High, and output original global bus data as the cache data if the inversion flag data is Low.

Thus, the cache data is reverted to the current read data in the memory bank 26. Further, neither data nor functions of an external port such as the DQ port 24 and a data bus inversion (DBI) port (not shown in the figures) of the semiconductor memory 20 will be changed.

Figure 8:
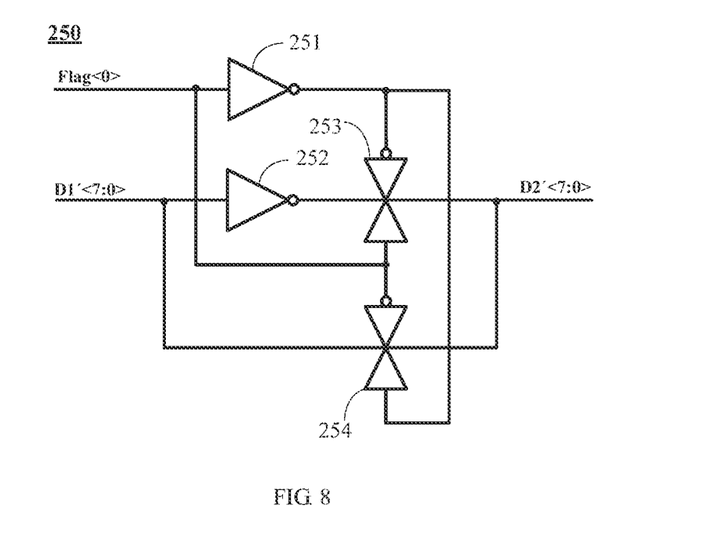
FIG. 8 schematically illustrates a block diagram of a data receiving unit according to an implementation manner of this embodiment.

In one embodiment, the data receiving module 25 may include a plurality of data receiving units 250, and each of the plurality of data receiving units 250 is configured to process 1-bit inversion flag data and a group of global bus data. For example, there may be 16 data receiving units 250, which are respectively corresponding to 16 groups of global bus data and 1-bit inversion flag data. FIG. 8 illustrates an implementation manner of the data receiving unit 250.

As shown in FIG. 8, the data receiving unit 250 includes a third inverter 251, a fourth inverter 252, a third transmission gate 253, and a fourth transmission gate 254.

An input terminal of the third inverter 251 is configured to receive the inversion flag data through the inversion flag signal line. An input terminal of the fourth inverter 252 is configured to receive the global bus data through the global bus. An input terminal of the third transmission gate 253 is connected to an output terminal of the fourth inverter 252, an output terminal of the third transmission gate 253 is connected to the parallel-to-serial conversion circuit 21 to output the cache data to the parallel-to-serial conversion circuit 21, a negative control terminal (the upper control terminal in FIG. 8) of the third transmission gate 253 is connected to an output terminal of the third inverter 251, and a positive control terminal of the third transmission gate 253 is configured to receive the inversion flag data through the inversion flag signal line. An input terminal of the fourth transmission gate 254 is configured to receive the global bus data through the global bus, an output terminal of the fourth transmission gate 254 is connected to the parallel-to-serial conversion circuit 21 to output the cache data to the parallel-to-serial conversion circuit 21, a negative control terminal (the upper control terminal in FIG. 8) of the fourth transmission gate 254 is configured to receive the inversion flag data through the inversion flag signal line, and a positive control terminal (the lower control terminal in FIG. 8) of the fourth transmission gate 254 is connected to the output terminal of the third inverter 251.

Taking Flag<0> and the global bus data D1'<7:0> as an example, as shown in FIG. 8, when Flag=1, the cache data D2'<7:0> is the inverted data of the global bus data D1'<7:0>. When Flag=0, the cache data D2'<7:0> is the global bus data D1'<7:0>. That is, D2'<7:0>=D1'<7:0>.

It is to be noted that a group of fourth inverter 252, third transmission gate 253 and fourth transmission gate 254 is configured to process 1-bit global bus data and output corresponding 1-bit cache data. That is, corresponding to 8-bit global bus data D1'<7:0>, there should be eight groups of fourth inverters 252, third transmission gates 253 and fourth transmission gates 254, and then 8-bit cache data D2'<7:0> is outputted.

As shown in FIG. 1 and FIG. 2, the read operation circuit in this embodiment further includes a parallel-to-serial conversion circuit 21. The parallel-to-serial conversion circuit 21 is connected to the data receiving module 25 to perform parallel-to-serial conversion on the cache data to generate output data of the DQ port 24. For example, the parallel-to-serial conversion circuit 21 performs parallel-to-serial conversion on 128-bit cache data D2'<127:0> corresponding to Bank 0 to generate 8-bit output data DQ<7:0>.

According to the semiconductor memory 20 of this embodiment, in the process of reading data (for example, all the data inputted in the first time are equal to 1, and all the data inputted in the second time are equal to 0) from the semiconductor memory 20, the global bus data has 256 bits. If it is needed to invert 256-bit global bus data, it is only needed to invert 32-bit inversion flag data, such that write current will be reduced significantly.

In practical applications, the semiconductor memory 20 of this embodiment also includes other structures such as a sense amplifier, which are not repeated in this embodiment because they belong to the existing technologies.

Figure 9:
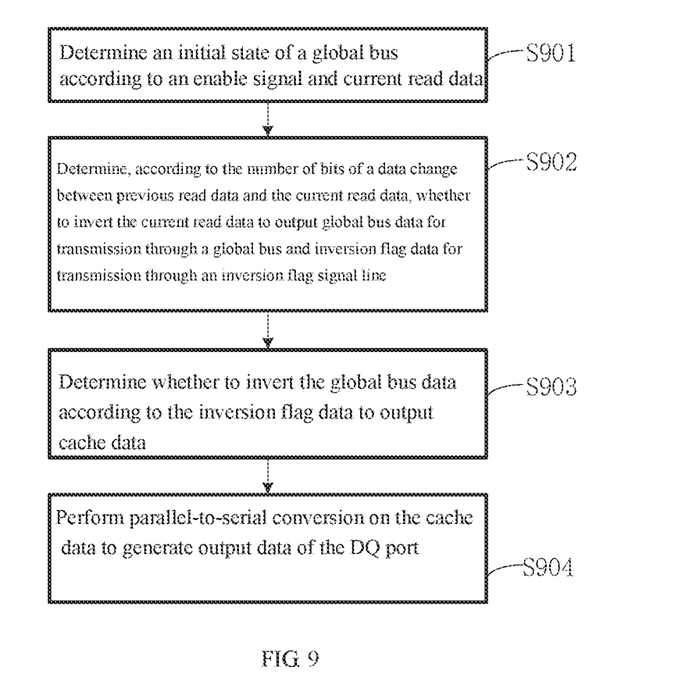
FIG. 9 schematically illustrates a flowchart of a read operation method according to an implementation manner of this embodiment.

FIG. 9 schematically illustrates a flowchart of a read operation method according to an implementation manner of this embodiment. The read operation method may be used in the semiconductor memory 20. As shown in FIG. 9, the read operation method may include:

Step S901: determining an initial state of a global bus according to an enable signal and current read data;

Step S902: determining, according to the number of bits of a data change between previous read data and the current read data, whether to invert the current read data to output global bus data for transmission through a global bus and inversion flag data for transmission through an inversion flag signal line;

Step S903: determining whether to invert the global bus data according to the inversion flag data to output cache data; and Step S904: performing parallel-to-serial conversion on the cache data to generate output data of the DQ port.

In one embodiment, the Step S902 may include: determining change flag data according to the change between the current read data and the previous read data; outputting inverted data of the current read data as the global bus data and setting the inversion flag data to High if the number of bits of high data in the change flag data is greater than a preset value; and outputting original current read data as the global bus data and setting the inversion flag data to Low if the number of bits of the high data in the change flag data is less than or equal to the preset value.

In one embodiment, the Step S902 may also include: dividing the change flag data into M groups, wherein each group of change flag data has N bits, and both the M and the N are integers greater than 1; outputting inverted data of a group of change flag data inputted as a corresponding group of global bus data and setting 1-bit inversion flag data corresponding to the group of change flag data inputted to High if the number of bits of high data in the group of change flag data inputted is greater than N/2; and outputting a group of change flag data inputted as a corresponding group of global bus data and setting 1-bit inversion flag data corresponding to the group of change flag data inputted to Low if the number of bits of the high data in the group of change flag data inputted is less than or equal to N/2.

The read operation circuit provided by the embodiments of the present disclosure is used in a semiconductor memory having a tristate global bus transmission structure, which can reduce the number of inversions of the internal global bus, such that electric current may be reduced significantly, and power consumption may be decreased.

Reference throughout this specification to the terms "one embodiment," "some embodiments," "one example," "an example," or "some examples," means that a feature, structure, material, or characteristic described in connection with the embodiment or example is included in at least one embodiment or example of the present disclosure. Furthermore, the features, structures, materials, or characteristics described may be combined in any suitable manner in one or more embodiments or examples. In addition, without contradiction, those skilled in the art may combine different embodiments or examples described in the specification and features of different embodiments or examples.

In addition, the features, structures, or characteristics described may be combined in one or more embodiments in any suitable manner. However, those skilled in the art will appreciate that one or more of the details may be practiced without practicing the technical solutions of the present disclosure, and other methods, components, materials, devices, steps, and the like may be employed. In other instances, well-known structures, methods, devices, implementations, materials, or operations are not shown or described in detail to avoid obscuring aspects of the present disclosure.

Terms "first" and "second" are used only for purposes of description and are not intended to indicate or imply relative importance or to imply the number of indicated technical features. Thus, the feature defined with "first" and "second" may explicitly or implicitly include at least one such feature. In the description of the present disclosure, "a plurality of" refers to at least two, unless otherwise expressly specified.

It is to be noted that, steps of the method in the present disclosure are described in a particular order in the accompanying drawings. However, this does not require or imply to execute these steps necessarily according to the particular order, or this does not mean that the expected result cannot be implemented unless all the shown steps are executed. Additionally or alternatively, some steps may be omitted, a plurality of steps may be combined into one step for execution, and/or one step may be decomposed into a plurality of steps for execution. Moreover, the above accompanying drawings are merely illustrative description of processes included in the method according to the exemplary embodiments of the present disclosure and are not intended to limit the present disclosure. It is easy to understand that the processes shown in the above accompanying drawings do not indicate or limit time sequences of these processes. Furthermore, it is also easy to understand that these processes may be executed, for example, synchronously or asynchronously in a plurality of modules.

In addition, although the spirit and the principle of the present disclosure have been described with reference to several embodiments, it should be understood that the present disclosure is not limited to these embodiments disclosed, and the division of various aspects does not mean that the features in these aspects cannot be combined to get benefits, and this division is only for ease of expression. The present disclosure is intended to cover various modifications and equivalent arrangements included within the spirit and scope of the appended claims.

The above-mentioned embodiments are merely embodiments of the present disclosure, but the protection scope of the present disclosure is not limited thereto. Any variation or substitution easily conceivable to a person of ordinary skills in the art within the technical scope disclosed in the present disclosure shall fall into the protection scope of the present disclosure. Therefore, the protection scope of the present disclosure shall be subject to the protection scope of the claims.

What is claimed is:

1. A read operation circuit used in a semiconductor memory, wherein the semiconductor memory comprises a Data Queue (DQ) port and a memory bank, the read operation circuit comprising:
   a data determination module connected to the memory bank, wherein the data determination module is configured to read data from the memory bank, and determine, according to number of bits of a data change between previous read data and current read data, whether to invert the current read data to output global bus data for transmission through a global bus and inversion flag data for transmission through an inversion flag signal line;
   a data receiving module connected to the global bus and the inversion flag signal line and configured to determine whether to invert the global bus data according to the inversion flag data to output cache data;
   a parallel-to-serial conversion circuit connected between the data receiving module and the DQ port and configured to perform parallel-to-serial conversion on the cache data to generate output data of the DQ port; and
   a data buffer module connected to the memory bank through the global bus, wherein the data buffer module is configured to receive an enable signal, and to determine an initial state of the global bus according to the enable signal and the current read data;

wherein the data determination module is configured to determine change flag data according to the change between the current read data and the previous read data, output inverted data of the current read data as the global bus data and set the inversion flag data to High if number of bits of high data in the change flag data is greater than a preset value, and output original current read data as the global bus data and set the inversion flag data to Low if the number of bits of the high data in the change flag data is less than or equal to the preset value;

wherein the change flag data and the global bus data are both divided into M groups, the inversion flag data having M bits, the M-bit inversion flag data being corresponding to the M groups of change flag data one to one, and the M-bit inversion flag data being corresponding to the M groups of global bus data one to one, wherein the M is an integer greater than 1.

2. The read operation circuit according to claim 1, wherein the data determination module comprises:

a data comparison unit, an input terminal of the data comparison unit being connected to the memory bank, wherein the data comparison unit is configured to set the change flag data to Low if there is no change between the current read data and the previous read data, and set the change flag data to High if there is the change between the current read data and the previous read data;

a data determination unit, an input terminal of the data determination unit being connected to an output terminal of the data comparison unit to receive the change flag data, an output terminal of the data determination unit being connected to the inversion flag signal line, wherein the data determination unit is configured to set the inversion flag data to High if the number of bits of the high data in the change flag data is greater than the preset value, and set the inversion flag data to Low if the number of bits of the high data in the change flag data is less than or equal to the preset value; and a data selector, an input terminal of the data selector being configured to receive the inversion flag data through the inversion flag signal line, an output terminal of the data selector being connected to the global bus, wherein the data selector is configured to output inverted data of the current read data as the global bus data if the inversion flag data is High, and output the original current read data as the global bus data if the inversion flag data is Low.

3. The read operation circuit according to claim 2, wherein the data comparison unit comprises:

a latch connected to the memory bank and configured to latch a state of the previous read data and a previous clock signal corresponding to the previous read data; and a state comparator connected to the memory bank and the latch, wherein the state comparator is configured to set the change flag data to Low if there is no change between a state of the current read data and the state of the previous read data, and set the change flag data to High if there is a change between the state of the current read data and the state of the previous read data.

4. The read operation circuit according to claim 1, wherein each group of change flag data has N bits, the N being an integer greater than 1, wherein the data determination module is configured to output inverted data of a group of change flag data inputted as a corresponding group of global bus data and set 1-bit inversion flag data corresponding to the group of change flag data inputted to High if the number of bits of high data in the group of change flag data inputted is greater than N/2, and output a group of change flag data inputted as a corresponding group of global bus data and set 1-bit inversion flag data corresponding to the group of change flag data inputted to Low if the number of bits of the high data in the group of change flag data inputted is less than or equal to N/2.

5. The read operation circuit according to claim 2, wherein the data selector comprises M data selection units, each of the M data selection units comprising:

a first inverter, an input terminal of the first inverter being configured to receive the inversion flag data through the inversion flag signal line;

a second inverter, an input terminal of the second inverter being configured to receive the current read data;

a first transmission gate, an input terminal of the first transmission gate being connected to an output terminal of the second inverter, an output terminal of the first transmission gate being connected to the global bus to output the global bus data, a negative control terminal of the first transmission gate being connected to an output terminal of the first inverter, and a positive control terminal of the first transmission gate being configured to receive the inversion flag data through the inversion flag signal line; and a second transmission gate, an input terminal of the second transmission gate being configured to receive the current read data, an output terminal of the second transmission gate being connected to the global bus to output the global bus data, a negative control terminal of the second transmission gate being configured to receive the inversion flag data through the inversion flag signal line, and a positive control terminal of the second transmission gate being connected to the output terminal of the first inverter.

6. The read operation circuit according to claim 1, wherein the data receiving module is configured to output inverted data of the global bus data as the cache data if the inversion flag data is High, and output original global bus data as the cache data if the inversion flag data is Low.

7. The read operation circuit according to claim 1, wherein the data receiving module comprises a plurality of data receiving units, each of the plurality of data receiving units comprising:

a third inverter, an input terminal of the third inverter being configured to receive the inversion flag data through the inversion flag signal line;

a fourth inverter, an input terminal of the fourth inverter being configured to receive the global bus data through the global bus;

a third transmission gate, an input terminal of the third transmission gate being connected to an output terminal of the fourth inverter, an output terminal of the third transmission gate being connected to the parallel-to-serial conversion circuit to output the cache data to the parallel-to-serial conversion circuit, a negative control terminal of the third transmission gate being connected to an output terminal of the third inverter, and a positive control terminal of the third transmission gate being configured to receive the inversion flag data through the inversion flag signal line; and a fourth transmission gate, an input terminal of the fourth transmission gate being configured to receive the global bus data through the global bus, an output terminal of the fourth transmission gate being connected to the parallel-to-serial conversion circuit to output the cache data to the parallel-to-serial conversion circuit, a negative control terminal of the fourth transmission gate being configured to receive the inversion flag data through the inversion flag signal line, and a positive control terminal of the fourth transmission gate being connected to the output terminal of the third inverter.

8. The read operation circuit according to claim 1, wherein the data buffer module comprises:
  a plurality of logic NAND gates, two input terminals of each of the plurality of logic NAND gates being configured to receive the enable signal and the current read data respectively;
  a plurality of fifth inverters, an input terminal of each of the plurality of fifth inverters being configured to receive the enable signal;
  a plurality of logic NOR gates, two input terminals of each of the plurality of logic NOR gates being configured to receive the current read data and connected to each of the plurality of fifth inverters respectively;
  a plurality of PMOS transistors, a gate of each of the plurality of PMOS transistors being connected to an output terminal of each of the plurality of logic NAND gates, and a drain of each of the plurality of PMOS transistors being connected to the global bus; and
  a plurality of NMOS transistors, a gate of each of the plurality of NMOS transistors being connected to an output terminal of each of the plurality of logic NOR gates, and a drain of each of the plurality of NMOS transistors being connected to the global bus and the drain of each of the plurality of PMOS transistors.

9. A semiconductor memory, comprising a Data Queue (DQ) port, a memory bank, and a read operation circuit, wherein the read operation circuit comprising:
  a data determination module connected to the memory bank, wherein the data determination module is configured to read read data from the memory bank, and determine, according to number of bits of a data change between previous read data and current read data, whether to invert the current read data to output global bus data for transmission through a global bus and inversion flag data for transmission through an inversion flag signal line;
  a data receiving module connected to the global bus and the inversion flag signal line and configured to determine whether to invert the global bus data according to the inversion flag data to output cache data;
  a parallel-to-serial conversion circuit connected between the data receiving module and the DQ port and configured to perform parallel-to-serial conversion on the cache data to generate output data of the DQ port; and
  a data buffer module connected to the memory bank through the global bus, wherein the data buffer module is configured to receive an enable signal to determine an initial state of the global bus according to the enable signal and the current read data;
  wherein the data determination module is configured to determine change flag data according to the change between the current read data and the previous read data, output inverted data of the current read data as the global bus data and set the inversion flag data to High if number of bits of high data in the change flag data is greater than a preset value, and output original current read data as the global bus data and set the inversion flag data to Low if the number of bits of the high data in the change flag data is less than or equal to the preset value;
  wherein the change flag data and the global bus data are both divided into M groups, the inversion flag data having M bits, the M-bit inversion flag data being corresponding to the M groups of change flag data one to one, and the M-bit inversion flag data being corresponding to the M groups of global bus data one to one, wherein the M is an integer greater than 1.

10. A read operation method used in a semiconductor memory, comprising:
  determining an initial state of a global bus according to an enable signal and current read data;
  determining, according to number of bits of a data change between previous read data and the current read data, whether to invert the current read data to output global bus data for transmission through a global bus and inversion flag data for transmission through an inversion flag signal line;
  determining whether to invert the global bus data according to the inversion flag data to output cache data; and
  performing parallel-to-serial conversion on the cache data to generate output data of a Data Queue (DQ) port;
  wherein the outputting inverted data of the current read data as the global bus data and setting the inversion flag data to High if the number of bits of high data in change flag data is greater than a preset value, and outputting original current read data as the global bus data and setting the inversion flag data to Low if the number of bits of the high data in the change flag data is less than or equal to the preset value comprise:
  the change flag data and the global bus data are both divided into M groups, the inversion flag data having M bits, the M-bit inversion flag data being corresponding to the M groups of change flag data one to one, and the M-bit inversion flag data being corresponding to the M groups of global bus data one to one, wherein the M is an integer greater than 1.

11. The read operation method according to claim 10, wherein the determining, according to the number of bits of a data change between previous read data and the current read data, whether to invert the current read data to output global bus data for transmission through a global bus and inversion flag data for transmission through an inversion flag signal line comprises:
  determining change flag data according to the change between the current read data and the previous read data; and
  outputting inverted data of the current read data as the global bus data and setting the inversion flag data to High if number of bits of high data in the change flag data is greater than a preset value, and outputting original current read data as the global bus data and setting the inversion flag data to Low if the number of bits of the high data in the change flag data is less than or equal to the preset value.

12. The read operation method according to claim 10, wherein each group of change flag data has N bits, the N being integers greater than 1,
  outputting inverted data of a group of change flag data inputted as a corresponding group of global bus data and setting 1-bit inversion flag data corresponding to the group of change flag data inputted to High if the number of bits of high data in the group of change flag data inputted is greater than N/2; and outputting a group of change flag data inputted as a corresponding group of global bus data and setting 1-bit inversion flag data corresponding to the group of change flag data inputted to Low if the number of bits of the high data in the group of change flag data inputted is less than or equal to N/2.

\* \* \* \* \*